United States Patent
Ohshima et al.

(10) Patent No.: US 6,795,370 B2
(45) Date of Patent: Sep. 21, 2004

(54) FAST CYCLE RAM HAVING IMPROVED DATA WRITE OPERATION

(75) Inventors: Shigeo Ohshima, Yokohama (JP); Hiroyuki Ohtake, Tokyo (JP); Katsumi Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/369,945

(22) Filed: Feb. 18, 2003

(65) Prior Publication Data

US 2003/0123297 A1 Jul. 3, 2003

Related U.S. Application Data

(63) Continuation of application No. 09/736,053, filed on Dec. 13, 2000, now Pat. No. 6,636,445.

(30) Foreign Application Priority Data

Dec. 13, 1999 (JP) .......................................... 11-353172

(51) Int. Cl.[7] ............................................... G11C 8/00
(52) U.S. Cl. ............. 365/230.08; 365/190; 365/189.05; 365/230.06
(58) Field of Search ........................... 365/230.08, 190, 365/189.05, 230.06

(56) References Cited

U.S. PATENT DOCUMENTS

| | | | |
|---|---|---|---|
| 5,323,358 A | 6/1994 | Toda | |
| 5,371,714 A | 12/1994 | Matsuda et al. | ....... 365/230.03 |
| 5,511,024 A | 4/1996 | Ware et al. | |
| 5,596,541 A | 1/1997 | Toda | |
| 5,717,653 A | 2/1998 | Suzuki | |
| 5,748,558 A | 5/1998 | Suzuki | |
| 5,757,704 A | 5/1998 | Hachiya | |
| 5,973,991 A | 10/1999 | Tsuchida et al. | |
| 5,978,300 A | 11/1999 | Toda | |
| 6,044,429 A | 3/2000 | Ryan et al. | |
| 6,049,490 A | 4/2000 | Kawasumi | |
| 6,061,294 A | 5/2000 | Koshikawa | ............ 365/189.05 |
| 6,088,291 A | 7/2000 | Fujioka et al. | |
| 6,108,243 A | 8/2000 | Suzuki et al. | .......... 365/189.01 |
| 6,125,071 A | 9/2000 | Kohno et al. | |
| 6,151,236 A | 11/2000 | Bondurant et al. | |
| 6,172,935 B1 | 1/2001 | Wright et al. | ............... 365/194 |
| 6,295,231 B1 | 9/2001 | Toda et al. | |
| 6,307,806 B1 | 10/2001 | Tomita et al. | ......... 365/230.03 |
| 6,636,445 B2 * | 10/2003 | Ohshima et al. | ............ 365/190 |

FOREIGN PATENT DOCUMENTS

JP          98/56004          12/1998

OTHER PUBLICATIONS

U.S. patent application Ser. No. 09/383,193, Tsuchida et al., filed Aug. 26, 1999.
U.S. patent application Ser. No. 10/175,085, Tsuchida et al., filed Jun. 20, 2002.

* cited by examiner

*Primary Examiner*—Van Thu Nguyen
*Assistant Examiner*—Tuan T. Nguyen
(74) *Attorney, Agent, or Firm*—Hogan & Hartson, LLP

(57) ABSTRACT

An input data register for latching write data is arranged in a position near a memory cell array of a memory core section. The input data register is arranged on the upstream side of a data path used for writing data into a memory cell. Write data input to a data pin which is arranged in the end position on the downstream side is latched in the input data register via a data input buffer, serial/parallel converting circuit and write data line. Data latched in the input data register is written into a memory cell via a DQ write driver, data line pair, I/O gate and bit line pair in a next write cycle.

18 Claims, 11 Drawing Sheets

US 6,795,370 B2

FAST CYCLE RAM HAVING IMPROVED DATA WRITE OPERATION

This is a continuation of application Ser. No. 09/736,053 filed Dec. 13, 2000 now U.S. Pat. No. 6,636,445, which application is hereby incorporated by reference in its entirety.

CROSS-REFERENCE TO RELATED APPLICATIONS

This application is based upon and claims the benefit of priority from the prior Japanese Patent Application No. 11-353172, filed Dec. 13, 1999, the entire contents of which are incorporated herein by reference.

BACKGROUND OF THE INVENTION

This invention relates to a semiconductor memory device and more particularly to a fast cycle synchronous DRAM (SDR-FCRAM) having a function of rapidly reading/writing random data from or into a memory cell array and a data write system of a double data rate synchronous DRAM (DDR-FCRAM) for realizing the data transfer rate twice that of the above DRAM.

In order to enhance the data access speed of the DRAM to that of an SDRAM and attain a large data band width (the number of data bytes for each unit time) by use of a high clock frequency (tCK), a synchronous DRAM (SDRAM) is invented and is already put into practice from the 4-Mbit or 16-Mbit DRAM generation. In the present 64-Mbit generation, the SDARM occupies a large part of the amount of all of the DRAMs used.

Recently, in order to further enhance the operation speed of the SDRAM, a double data rate SDRAM which is operated at the data transfer rate twice that of the conventional case by operating the same in synchronism with both of the leading edge and trailing edge of a clock signal is proposed and actively commercialized.

In order to enhance the data transfer rate in the SDRAM, the data bandwidth is actively increased, but it is difficult to make random access to cell data in a memory core, that is, to enhance the speed of data access to a row address which has been changed to indicate a different row. This is because the cycle time (random cycle time=tRC) of the memory core cannot be greatly reduced since a certain period of time (which is referred to as core latency) is required for the destructive readout and amplifying operation inherent to the DRAM and the precharge operation prior to the next access to the memory core in the SDRAM.

In order to solve the above problem, a so-called fast cycle RAM (FCRAM) in which access to the memory core and the precharge operation thereof are pipelined to reduce the random cycle time of the conventional DRAM to half or less is proposed and will be started to be commercialized mainly in the network field in which random data of a router or LAN switch using SRAMs in the prior art is transferred at high speed.

The basic system of the data readout operation of the FCRAM is described in International Application (International Publication Number WO98/56004 (Fujioka et al.) using Jpn. Pat. Appln. Nos. 09-145406, 09-215047 and 09-332739 as the basic application, for example.

BRIEF SUMMARY OF THE INVENTION

According to an aspect of the present invention, there is provided a semiconductor memory device comprising: means for latching data to be written into the memory cell; and means for driving a data line pair according to write data latched in the means for latching data, wherein writing of data fetched from the exterior in response to input of a command is started when a next command is set.

According another aspect of the present invention, there is provided a data write method for a fast cycle random access memory comprising the steps of: supplying serial data input to a data pin from the exterior to a data input buffer, converting the serial data into parallel data in a serial/parallel converting circuit and them transferring the parallel data to an input data register provided adjacent to a DQ write driver via a write data line; and writing data, which is latched in the input data register in a preceding write cycle, into a memory cell via the DQ write driver, a data line pair, an I/O gate and a bit line pair when data is written into the memory cell in a next write cycle.

DETAILED DESCRIPTION OF THE INVENTION

[First Embodiment]

Figure 1:
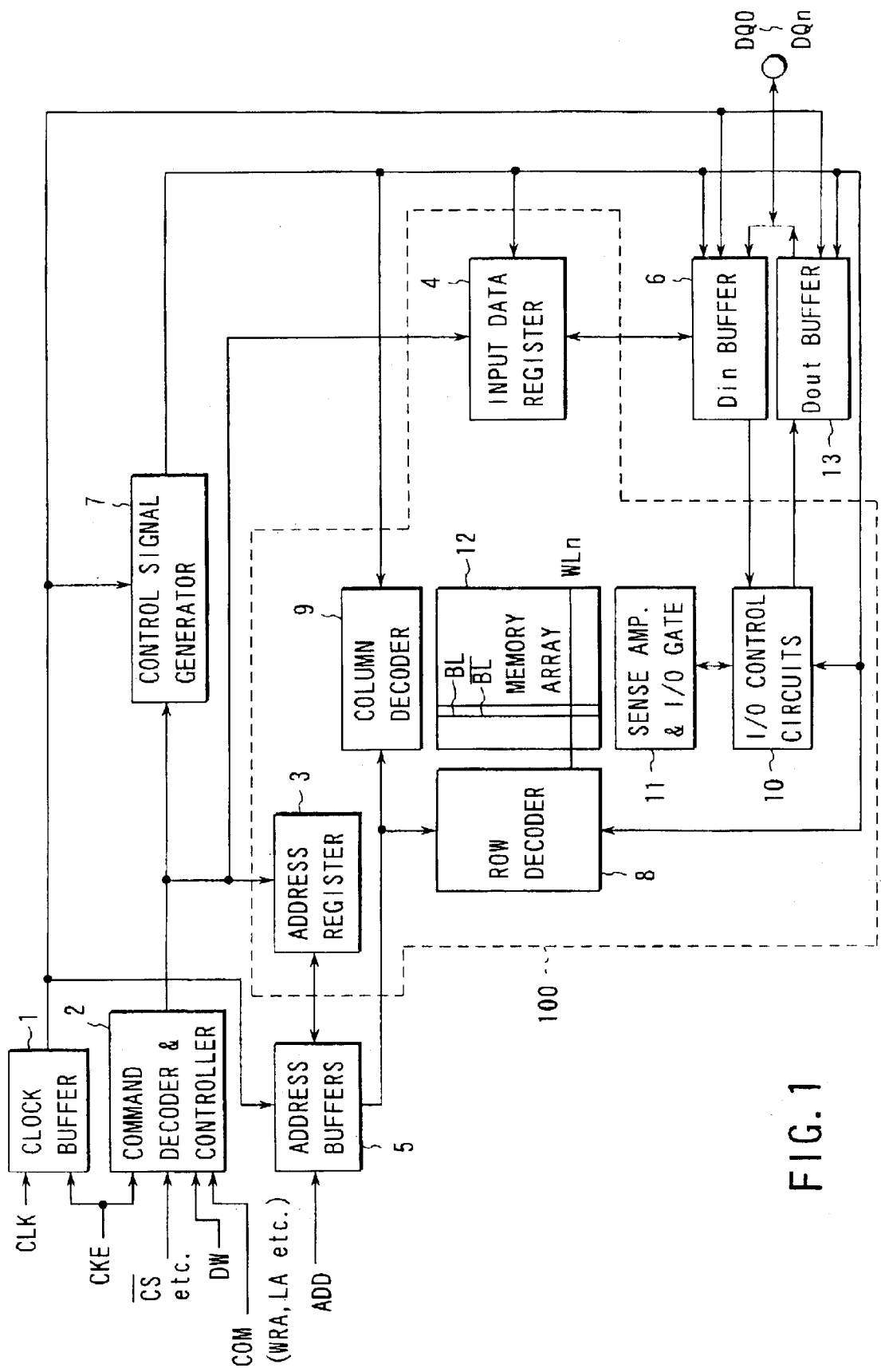
FIG. 1 is a block diagram showing the schematic basic construction of an FCRAM, for illustrating a semiconductor memory device according to a first embodiment of this invention.
Figure 2:
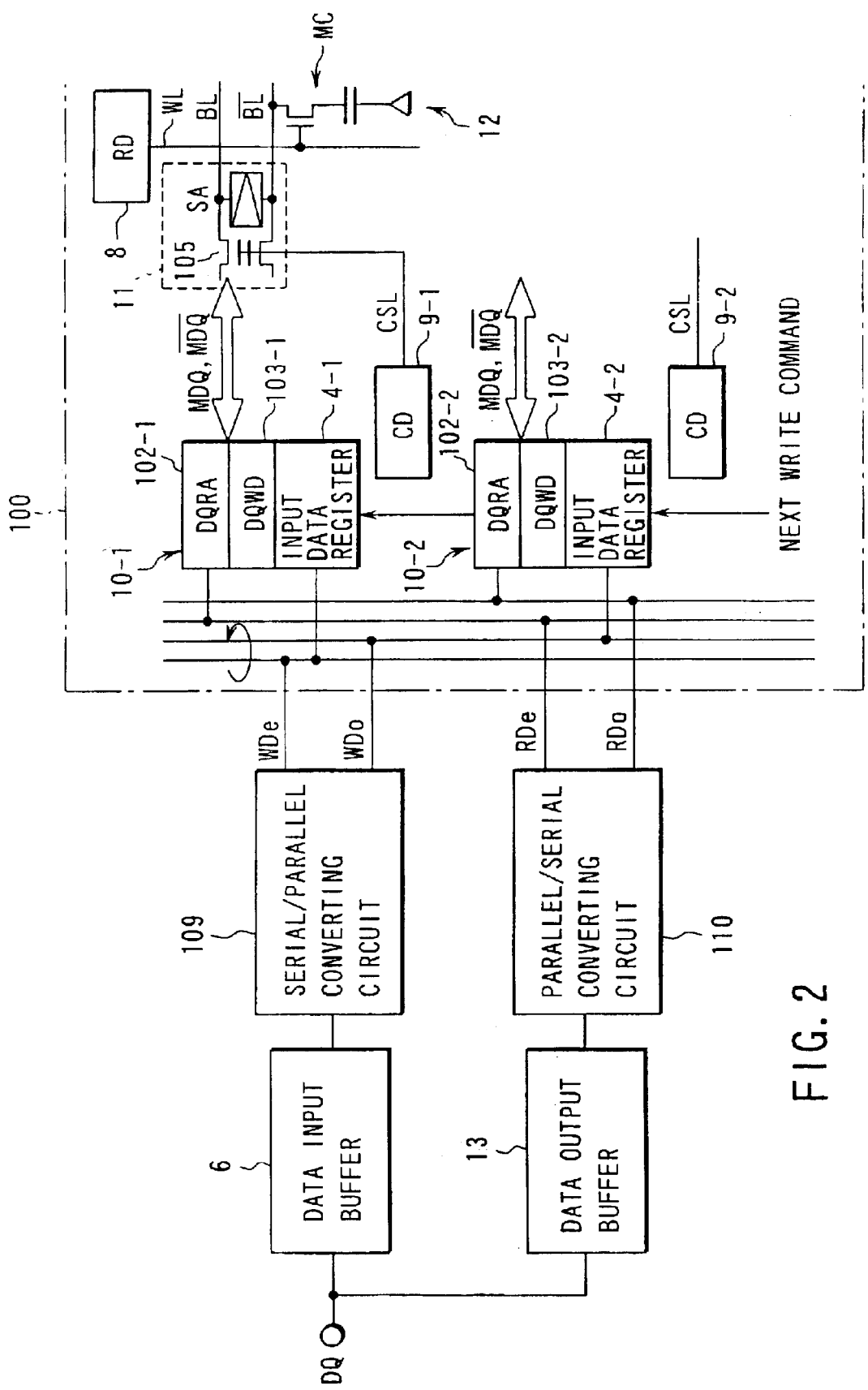
FIG. 2 is a block diagram showing the schematic construction of an extracted main portion associated with the data write and readout operation of a DDR-SDRAM, for illustrating the semiconductor memory device according to the first embodiment of this invention.
Figure 3:
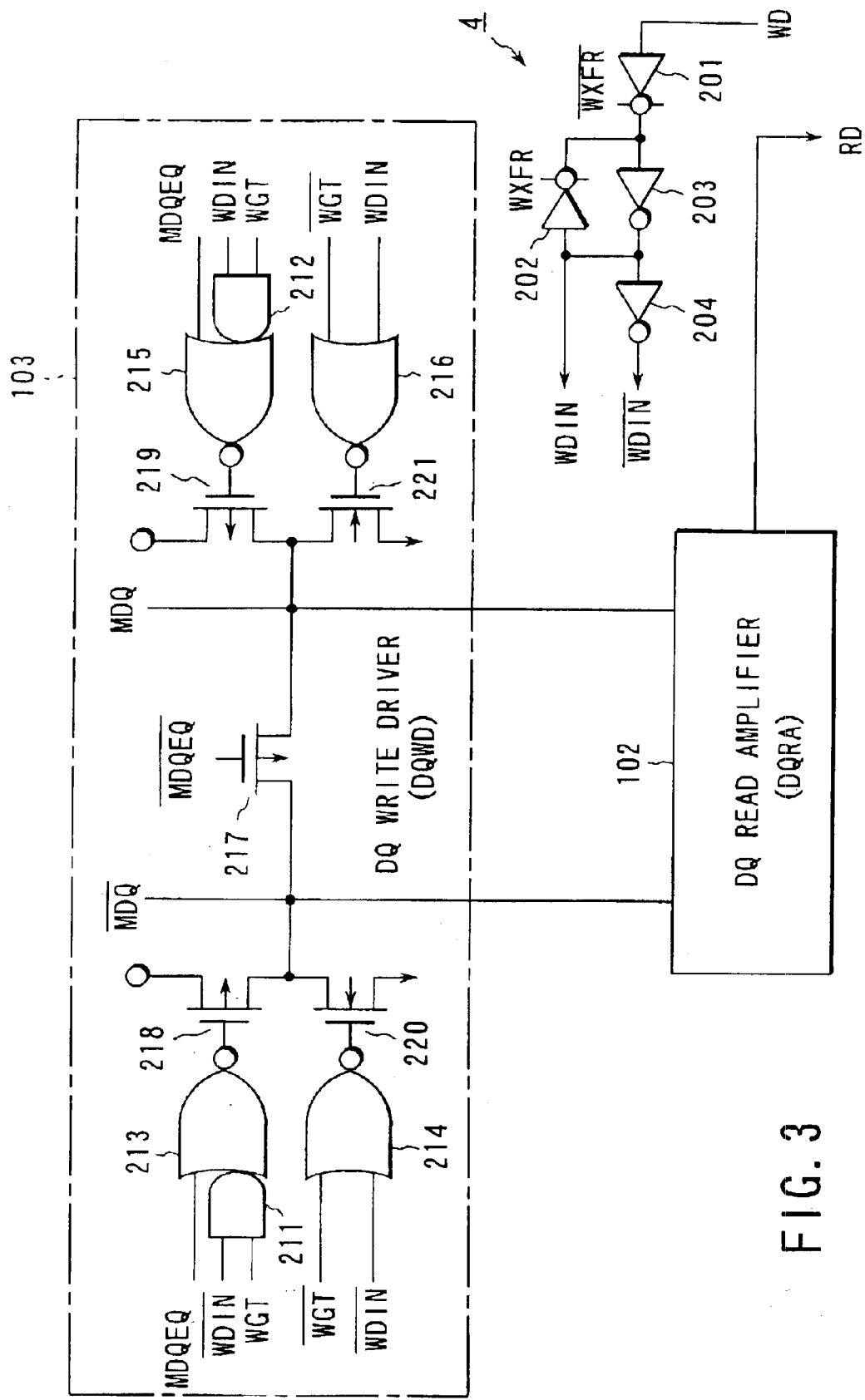
FIG. 3 is a circuit diagram showing an example of the concrete circuit construction of a DQ write driver and input data register (latch circuit) in a circuit shown in FIG. 2, for illustrating the semiconductor memory device according to the first embodiment of this invention.
Figure 4:
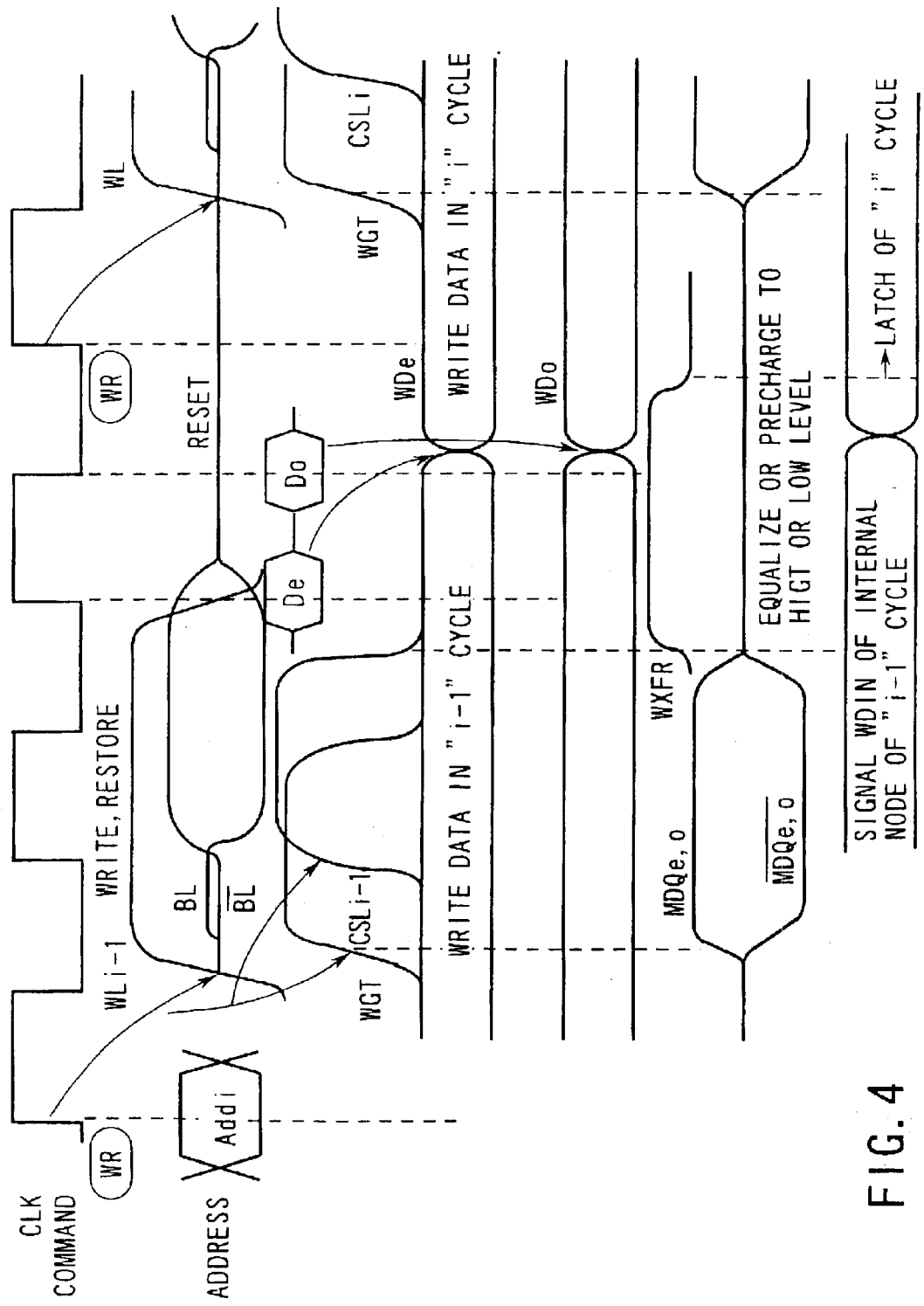
FIG. 4 is a timing chart showing the operation of the circuits shown in FIGS. 2 and 3, for illustrating the semiconductor memory device according to the first embodiment of this invention.

FIGS. 1 to 4 are diagrams for illustrating a semiconductor memory device according to a first embodiment of this invention, FIG. 1 being a block diagram showing the schematic basic construction of an FCRAM and FIG. 2 being a block diagram showing the schematic construction of an extracted main portion associated with the data write and readout operation of a DDR-SDRAM. Further, FIG. 3 is a circuit diagram showing an example of the concrete circuit construction of a DQ write driver and input data register (latch circuit) in the circuit shown in FIG. 2. FIG. 4 is a timing chart for illustrating the operation of the circuits shown in FIGS. 2 and 3, and in this case, an example in which the burst length is set to "2" based on the specification of the DDR-SDRAM is shown.

As shown in FIG. 1, the FCRAM (SDR-FCRAM, DDR-FCRAM) includes a clock buffer 1, command decoder & controller 2, address register 3, input data register 4, address buffer 5, data input buffer (Din BUFFER) 6, control signal generator 7, row decoder 8, column decoder 9, I/O control circuit 10, sense amplifier & I/O gate 11, memory cell array 12 and data output buffer (Dout BUFFER) 13. The memory cell array 12, address register 3, row decoder 8, column decoder 9, sense amplifier & I/O gate 11 and I/O control circuit 10 are arranged in a memory core section 100. The clock buffer 1, command decoder & controller 2, address buffer 5, control signal generator 7, data input buffer 6 and data output buffer 13 are arranged in a peripheral area of the memory core section 100.

The clock buffer 1 is supplied with a clock signal CLK used as a reference of the operation timing from the exterior. The clock buffer 1 supplies a clock signal to various circuits such as the address buffer 5, control signal generator 7, data input buffer 6 and data output buffer 13 to define the operation timings thereof under control of a clock enable signal CKE.

The command decoder & controller 2 is supplied with the clock enable signal CKE, a control signal such as a chip select signal $\overline{CS}$, a control signal DW for specifying a "normal write operation" or "delayed write operation (which is called 'late write operation' in this specification)" and various commands COM (write command WRA, column address latch command LA and the like). The command decoder & controller 2 decodes the various commands COM and controls the operations of the circuits in the DRAM according to the result of decoding and the above control signals. In FIG. 1, an example in which the address register 3, input data register 4 and control signal generator 7 are controlled is shown.

The address buffer 5 is supplied with an address signal (row address signal and column address signal) ADD and respectively supplies a row address signal and column address signal to the row decoder 8 and column decoder 9 in response to the clock signal supplied from the clock buffer 1. The row address signal is decoded by the row decoder 8 to select a word line WLn in the memory cell array 12 and the column address signal is decoded by the column decoder 9 to specify bit lines BL, $\overline{BL}$ in the memory cell array 12. As a result, one of the memory cells in the memory cell array 12 is selected.

Data read out from a selected one of the memory cells in the memory cell array 12 is sensed and amplified by the sense amplifier & I/O gate 11, then supplied to the data output buffer 13 via the I/O control circuit 10 and output from data pins (external data pins) DQ0 to DQn. Write data input to the data pins DQ0 to DQn is supplied to the data input buffer 6 and written into the selected one of the memory cells in the memory cell array 12 via the I/O control circuit 10 and sense amplifier & I/O gate 11.

The address register 3 is connected to the address buffer 5 and holds or stores address information of a memory cell used as a late write object under control of the command decoder & controller 2. The input data register 4 is connected to the data input buffer 6 and holds or stores write data information of a memory cell used as a late write object under control of the command decoder & controller 2.

Then, the core circuit of the DRAM, for example, the row decoder 8, column decoder 9, input data register 4, data input buffer 6, data output buffer 13 and I/O control circuit 10 are controlled by a control signal output from the control signal generator 7.

With the above construction, the "normal write operation" and "late write operation" are effected as follows. That is, if the "normal write operation" is selected by a control signal DW, the address register 3 and input data register 4 are both set into a non-active state by the control of the command decoder & controller 2. Then, write data input to the data pins DQ0 to DQn is written into a memory cell selected by an address signal ADD input to the address buffer 5 via the data input buffer 6, I/O control circuit 10 and sense amplifier & I/O gate 11.

On the other hand, if the "late write operation" is selected by the control signal DW, the address register 3 and input data register 4 are both set into an active state by the control of the command decoder & controller 2 and outputs of the address buffer 5 and data input buffer 6 are respectively supplied to and stored in the address register 3 and input data register 4. Then, the timing at which data is actually written into the memory cell is started from the timing set by the "next" write command, and until then, an address signal ADD input to the address buffer 5 is stored in the address register 3 and write data input to the data input buffer 6 is stored in the data register 4.

FIG. 2 specifically shows an extracted portion of the memory core section and the peripheral area thereof associated with the data write and readout operation of the FCRAM shown in FIG. 1, and in this example, a DDR-SDRAM is shown. In the memory core section 100, the memory cell array 12, row decoder (RD) 8, column decoders (CD) 9-1, 9-2, . . . , sense amplifiers SA, I/O gates 105, I/O control circuits 10-1, 10-2, . . . and the like are provided.

The I/O control circuits 10-1, 10-2, . . . respectively include DQ read amplifiers (DQRA) 102-1, 102-2, . . . and DQ write drivers (DQWD) 103-1, 103-2, . . . and input data registers (latch circuits) 4-1, 4-2, . . . are provided in correspondence to the I/O control circuits 10-1, 10-2, . . . . The DQ read amplifiers 102-1, 102-2, . . . and DQ write drivers 103-1, 103-2, . . . are respectively connected to the I/O gates 105, sense amplifiers SA, bit line pairs BL, $\overline{BL}$ and memory cells MC via data line pairs MDQ, $\overline{MDQ}$. Although not shown in the drawing, the memory cells MC are disposed in intersecting positions between the bit line pairs BL, $\overline{BL}$ and the word lines WL and arranged in a matrix form.

The DQ read amplifiers 102-1, 102-2, . . . and DQ write drivers 103-1, 103-2, . . . are arranged in a position which is set as close to the memory cell array 12 as possible and formed at a pitch which is substantially a multiple of that of bit line pairs BL, $\overline{BL}$. For example, in an FCRAM with a 16-bit I/O construction, if the maximum burst length is "4" and the number of successive bit line pairs of one memory core section 100 is "2048", the number of DQ read amplifiers and DQ write drivers which are simultaneously operated is 16×4=64, and therefore, one set of DQ read amplifier and DQ write driver is repeatedly arranged for every 2048+ 64=32 bit line pairs.

The column decoders 9-1, 9-2, . . . are provided in correspondence to the I/O control circuits 10-1, 10-2, . . . and the ON/OFF states of the I/O gates 105 are controlled according to potential levels of column selection lines CSL to which output signals of the column decoders 9-1, 9-2, . . . are respectively supplied. If the potential of the selected column selection line CSL rises to the "H" level, a corresponding one of the I/O gates 105 is turned ON to connect the data line pair MDQ, $\overline{\text{MDQ}}$ to the bit line pair BL, $\overline{\text{BL}}$.

The data input buffer 6, serial/parallel converting circuit 109, write data lines WDe, WDo, data output buffer 13, parallel/serial converting circuit 110 and readout data lines RDe, RDo are arranged in the peripheral area of the memory core section 100.

Write data (serial data) input from a data pin (external DQ pin) DQ to the data input buffer 6 is converted into parallel data by the serial/parallel converting circuit 109 and supplied to and latched in the input data registers 4-1, 4-2, . . . via the write data lines WDe, WDo. Data items latched in the input data registers 4-1, 4-2, . . . are supplied to the DQ write drivers 103-1, 103-2, . . . and the data line pairs MDQ, $\overline{\text{MDQ}}$ are driven by the DQ write drivers 103-1, 103-2, . . . . If the potential of the column selection line CSL selected by one of the column decoders 9-1, 9-2, . . . rises, data on the data line pair MDQ, $\overline{\text{MDQ}}$ is supplied to the sense amplifier SA via the selected I/O gate 105 and written into the memory cell MC via the bit line pair BL, $\overline{\text{BL}}$.

Data read out from the memory cell MC is supplied to the sense amplifier SA via the bit line pair BL, $\overline{\text{BL}}$, sensed and amplified, and then supplied to a corresponding one of the DQ read amplifiers 102-1, 102-2, . . . via the selected I/O gate 105 and data line pair MDQ, $\overline{\text{MDQ}}$. The readout data amplified by the DQ read amplifier is supplied to the parallel/serial converting circuit 110 via the readout data line RDe, RDo and converted into serial data. An output signal of the parallel/serial converting circuit 110 is fetched by the data output buffer 13 and output from the data pin DQ.

FIG. 3 is a circuit diagram showing an example of the concrete circuit construction of the DQ write drivers 103-1, 103-2, . . . and input data registers (latch circuits) 4-1, 4-2, . . . provided in the I/O control circuits 10-1, 10-2, . . . in the circuit shown in FIG. 2.

The input data register 4 (4-1, 4-2, . . . ) includes clocked inverters 201, 202 which are gate-controlled by signals $\overline{\text{WXFR}}$, WXFR and inverters 203, 204. The signal WXFR is a signal which rises to the "H" level in synchronism with termination of the late write operation after the selecting operation of the column selection line CSL is terminated and $\overline{\text{WXFR}}$ is an inverted signal thereof. The clocked inverter 201 and the inverters 203, 204 are cascade-connected in this order. The output terminal and input terminal of the clocked inverter 202 are respectively connected to the input terminal and output terminal of the inverter 203. The write data line WD (WDe, WDo) is connected to the input terminal of the clocked inverter 201 and write data is supplied thereto, and a signal WDIN corresponding to latched write data is output from the output terminal (internal node) of the inverter 203 and an inverted signal $\overline{\text{WDIN}}$ of the signal WDIN is output from the output terminal (internal node) of the inverter 204.

The DQ write driver 103 (103-1, 103-2, . . . ) includes AND gates 211, 212, NOR gates 213 to 216, P-channel MOS transistors 217 to 219 and N-channel MOS transistors 220, 221. The signal $\overline{\text{WDIN}}$ corresponding to write data latched in the input data register 4 and a write gate pulse WGT of the DQ write driver 103 are supplied to the respective input terminals of the AND gate 211 and an output signal thereof is supplied to one of the input terminals of the NOR gate 213. The other input terminal of the NOR gate 213 is supplied with an equalizing signal MDQEQ for the data line pair $\overline{\text{MDQ}}$, MDQ and an output signal thereof is supplied to the gate of the MOS transistor 218. The source of the MOS transistor 218 is connected to the power supply and the drain thereof is connected to the data line $\overline{\text{MDQ}}$. A write gate pulse $\overline{\text{WGT}}$ and the signal $\overline{\text{WDIN}}$ are supplied to the respective input terminals of the NOR gate 214 and an output signal thereof is supplied to the gate of the MOS transistor 220. The drain of the MOS transistor 220 is connected to the data line $\overline{\text{MDQ}}$ and the source thereof is connected to the ground node.

The signal WDIN corresponding to write data latched in the input data register 4 and the write gate pulse WGT are supplied to the respective input terminals of the AND gate 212 and an output signal thereof is supplied to one of the input terminals of the NOR gate 215. The other input terminal of the NOR gate 215 is supplied with the equalizing signal MDQEQ and an output signal thereof is supplied to the gate of the MOS transistor 219. The source of the MOS transistor 219 is connected to the power supply and the drain thereof is connected to the data line MDQ. The write gate pulse $\overline{\text{WGT}}$ and the signal WDIN are supplied to the respective input terminals of the NOR gate 216 and an output signal thereof is supplied to the gate of the MOS transistor 221. The drain of the MOS transistor 221 is connected to the data line MDQ and the source thereof is connected to the ground node.

The current path of the MOS transistor 217 is connected between the paired data lines $\overline{\text{MDQ}}$ and MDQ and the equalizing signal $\overline{\text{MDQEQ}}$ is supplied to the gate of the MOS transistor 217.

In the FCRAM (DDR-FCRAM) according to this embodiment, like the normal SRAM, write data input from the exterior is transferred to the write data lines WDe, WDo and then further transferred to the input data registers (latch circuits) 4-1, 4-2, . . . provided adjacent to the DQ write drivers 103. Therefore, when data is actually written into the memory cell MC in the next cycle, write data input from the exterior in the preceding write cycle can be transferred to the upstream side of the data path of the whole write data, that is, the data path of the data pin DQ lying in the end on the downstream side→data input buffer 6→serial/parallel converting circuit 109→write data lines WDe, WDo→input data registers 4-1, 4-2→DQ write drivers 103-1, 103-2→data line pair MDQ, $\overline{\text{MDQ}}$→I/O gate 105→bit line pair BL, $\overline{\text{BL}}$→the memory cell MC lying on the upstream side in the circuit shown in FIG. 2. Thus, in the next write cycle, the data path used for writing data into the memory cell MC can be shortened and the write operation speed can be enhanced. As a result, the random cycle time tRC at the write time can be reduced.

Next, the operation of the latch circuit acting as the input data register 4 is explained in detail with reference to the timing chart of FIG. 4. Write data input from the data pin DQ in the first write cycle ("i-1") is transferred to the memory core section 100 via the data input buffer 6, serial/parallel converting circuit 109 and write data lines WDe, WDo. In this cycle, the operation for writing data fetched in the preceding write cycle into the memory cell MC based on the late write operation is effected and the potential of the column selection line CSLi-1 rises to the "H" level for the write operation. The signal WXFR is a signal which rises in synchronism with termination of the late write operation after the pulse (selecting operation) of the column selection line CSLi-1 is terminated and permits the contents of the write data lines WDe, WDo to be fetched into the internal nodes (signals WDIN, $\overline{\text{WDIN}}$) of the input data register 4. The data fetched into the internal node is kept held from the start of the next write cycle ("i"), that is, from when a clock edge for fetching the write command WR is received until the write gate pulse WGT of the DQ write driver 103 is generated.

When the write gate pulse WGT rises to the "H" level, the DQ write driver 103 is activated to immediately drive the paired data lines MDQ, $\overline{\text{MDQ}}$ to the states corresponding to the signals WDIN, $\overline{\text{WDIN}}$ of the internal nodes of the input register 4. After this, when the potential of the column selection line CSLi rises to the "H" level, data of the data line pair MDQ, $\overline{\text{MDQ}}$ is transferred to the bit line pair BL, $\overline{\text{BL}}$, amplified by the sense amplifier SA and written into the memory cell MC. When the operation by the write gate pulse WGT and column selection line CSL is terminated, next write data is transferred to the write data lines WDe, WDo and fetched into the internal nodes (signals (WDIN, $\overline{\text{WDIN}}$) of the input data register 4 in response to the signal WXFR.

By repeatedly effecting the above operation, the late write operation is effected and the effect that the random cycle time tRC is reduced can be maintained. Further, the latch circuit used as the input data register 4 is extremely simple in construction and can be formed with transistors having a small driving ability. Therefore, as described in the above example, there occurs no problem when one set of the DQ read amplifier 102 and DQ write driver 103 is repeatedly arranged for every 32 bit line pairs. As a result, the input data registers 4 (4-1, 4-2, . . . ) can be easily buried in the repeatedly arranged area of the DQ read amplifiers 102 and DQ write drivers 103 and interconnections for the signals WDIN, $\overline{\text{WDIN}}$ of the internal nodes and the signals WXFR, $\overline{\text{WXFR}}$ can be made extremely simple. Thus, an increase in the chip size can be suppressed.

[Second Embodiment]

Figure 5:
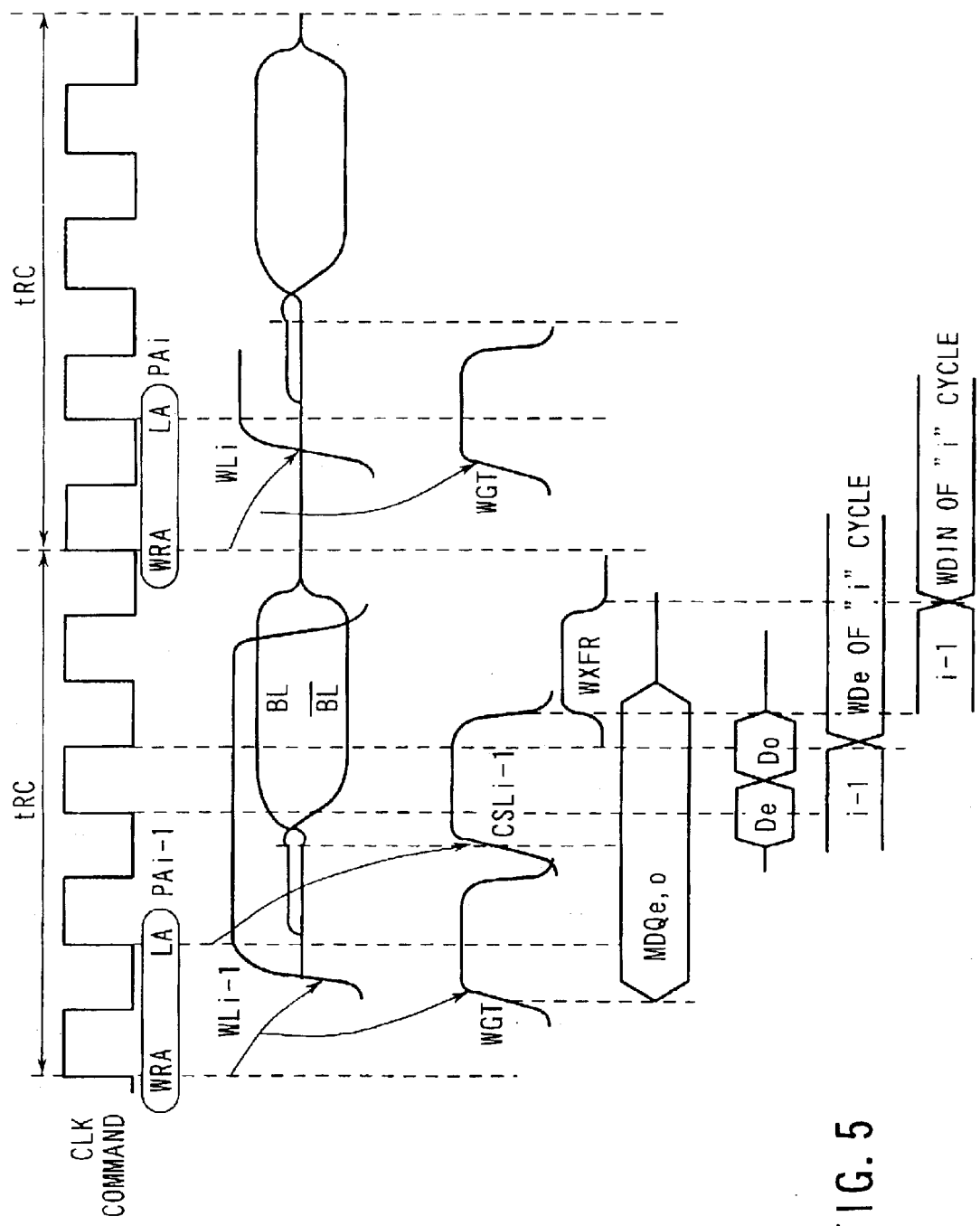
FIG. 5 is a timing chart for illustrating a semiconductor memory device according to a second embodiment of this invention.

FIG. 5 is a timing chart for illustrating a data write method for a semiconductor memory device according to a second embodiment of this invention. In the first embodiment, the FCRAM in which the command is supplied in one clock cycle is explained as an example, but the second embodiment is applied to a case wherein the command is supplied as a packet in two successive clock cycles as is disclosed in International Application WO98/56004.

As the actual FCRAM operation, the refresh operation and a function of mode set cycle as in an SDRAM are provided in addition to the read/write operation, and therefore, it is difficult to realize all of the operations by giving a command only once in the random cycle time tRC as explained so far. Therefore, it is more realistic to define the operations by a combination of two commands given as a packet in the successive clock cycles as disclosed in the above Application.

For example, if a write command WRA as a first command and a column address latch command LA as a second command are given to an FCRAM as one packet PA, the device is operated in response to successive clock input pulses. As a result, the command interval becomes minimum and time of the command cycle can be reduced. By fetching the write command WRA and column address latch command LA in synchronism with the two successive clocks CLK, the write gate pulse WGT can be generated in response to input of the write command WRA to activate the DQ write driver 103 so as to drive the data line pair MDQ, $\overline{\text{MDQ}}$ according to the contents (signals WDIN, $\overline{\text{WDIN}}$) of the internal nodes of the input data register 4. Next, the column selection line CSL is selected in response to input of the column address latch command LA to turn ON the I/O gate 105 so as to transfer data on the data line pair MDQ, $\overline{\text{MDQ}}$ to the bit line pair BL, $\overline{\text{BL}}$ and write the data into the memory cell MC.

At this time, selection and activation of the word line WL corresponding to the row address (which is held in the address register) of the memory cell array 12 in which data is to be written are started in response to input of the write command WRA and the sensing operation by the sense amplifier SA is started. However, since the command is a combination of the two commands WRA and LA given as one packet PA in the successive clock cycles and the length of the clock cycles is sufficiently shorter than time Tsense required for selection and activation of the word line WL and starting of the operation of the sense amplifier SA, the operation of the sense amplifier SA is not yet started when the column selection line CSL is selected by inputting the column address latch command LA which is the second command and data on the data line pair MDQ, $\overline{\text{MDFQ}}$ is written on the bit line pair BL, $\overline{\text{BL}}$. Therefore, newly written data can be supplied to the bit line pair BL, $\overline{\text{BL}}$ and sensed and restored by the sense amplifier SA without conflicting with the operation for sensing and restoring stored data of the memory cell MC. Thus, the operation for sensing and restoring data into the memory cell can be effected at substantially the same speed as the normal readout operation and the random cycle time tRC at the write time will not restrict the operation speed of the FCRAM.

[Third Embodiment]

Figure 6:
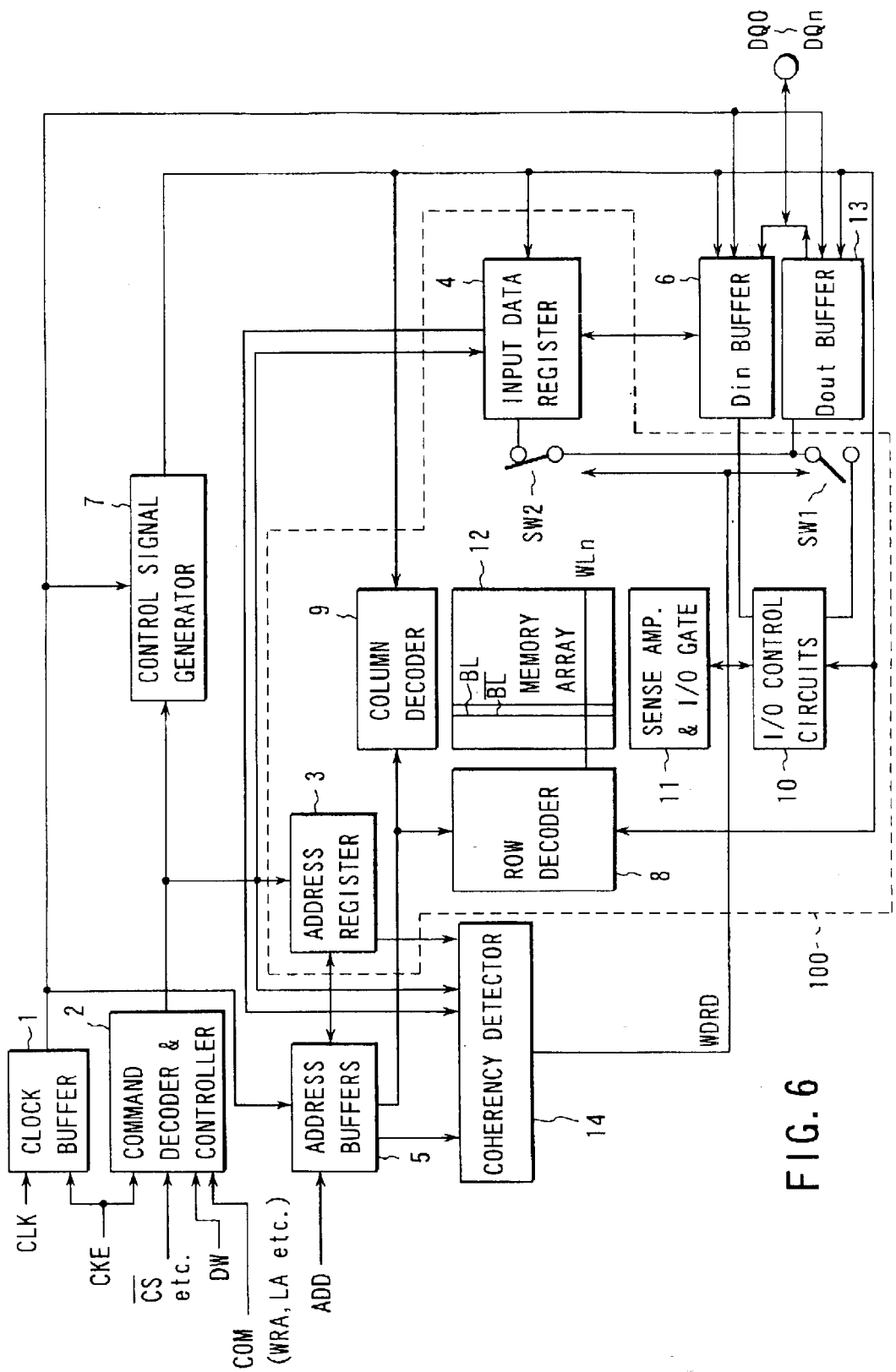
FIG. 6 is a block diagram showing the schematic basic construction of an FCRAM, for illustrating a semiconductor memory device according to a third embodiment of this invention.
Figure 7A:
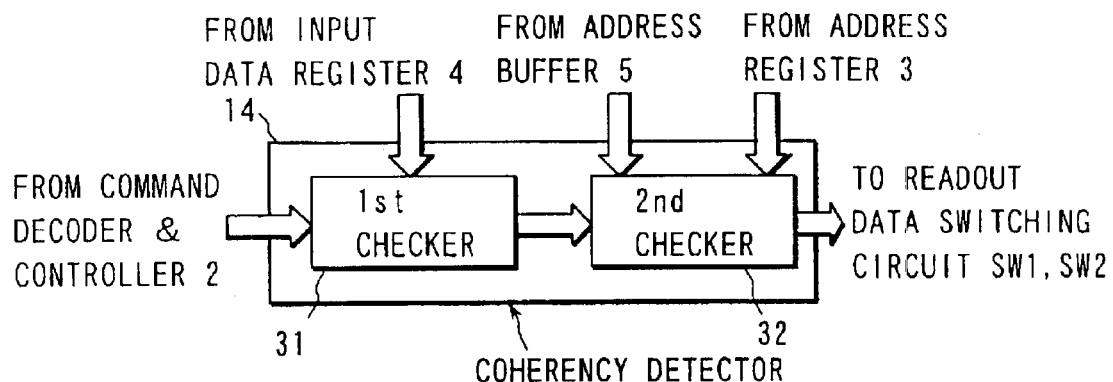
FIGS. 7A and 7B are block diagrams each showing the construction of an address coherency detector in the circuit shown in FIG. 6, for illustrating the semiconductor memory device according to the third embodiment of this invention.
Figure 7B:
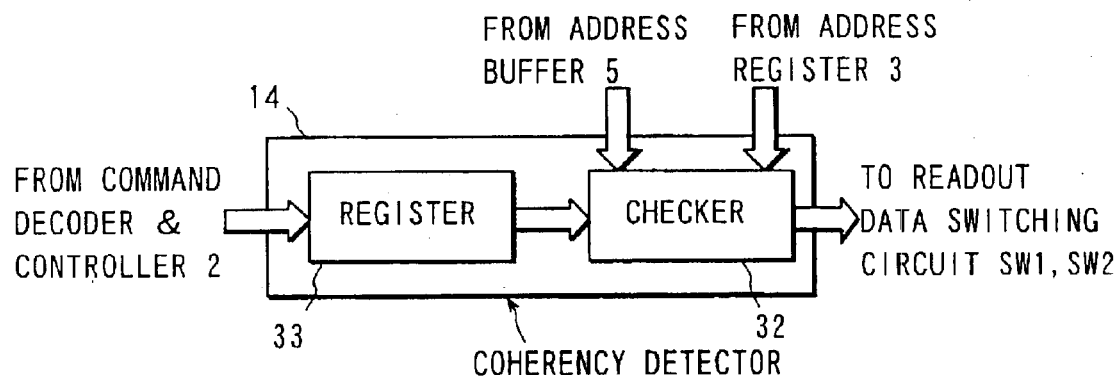
Figure 8:
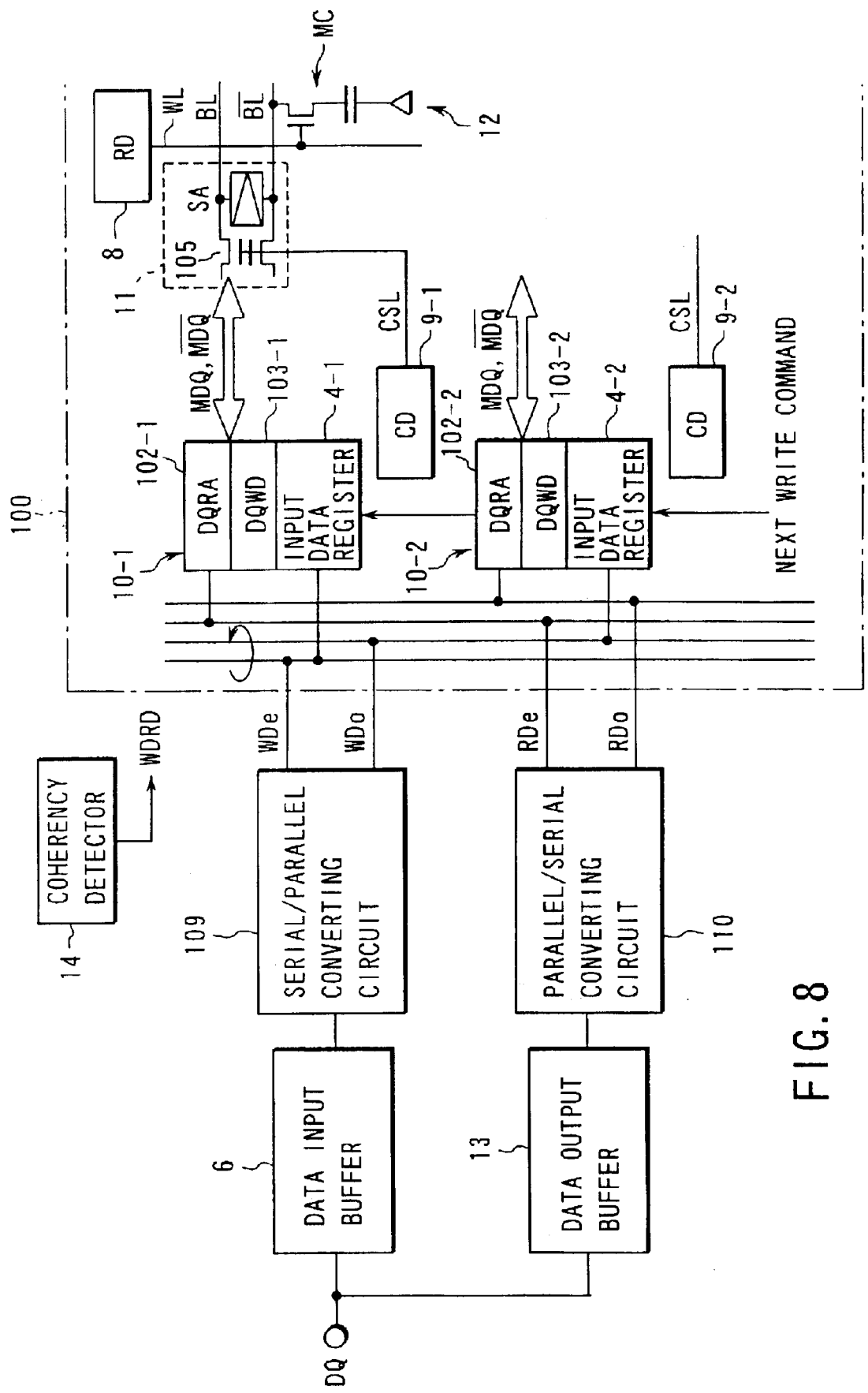
FIG. 8 is a block diagram showing the schematic construction of an extracted portion associated with the data write and readout operation of a DDR-SDRAM, for illustrating the semiconductor memory device according to the third embodiment of this invention.
Figure 9:
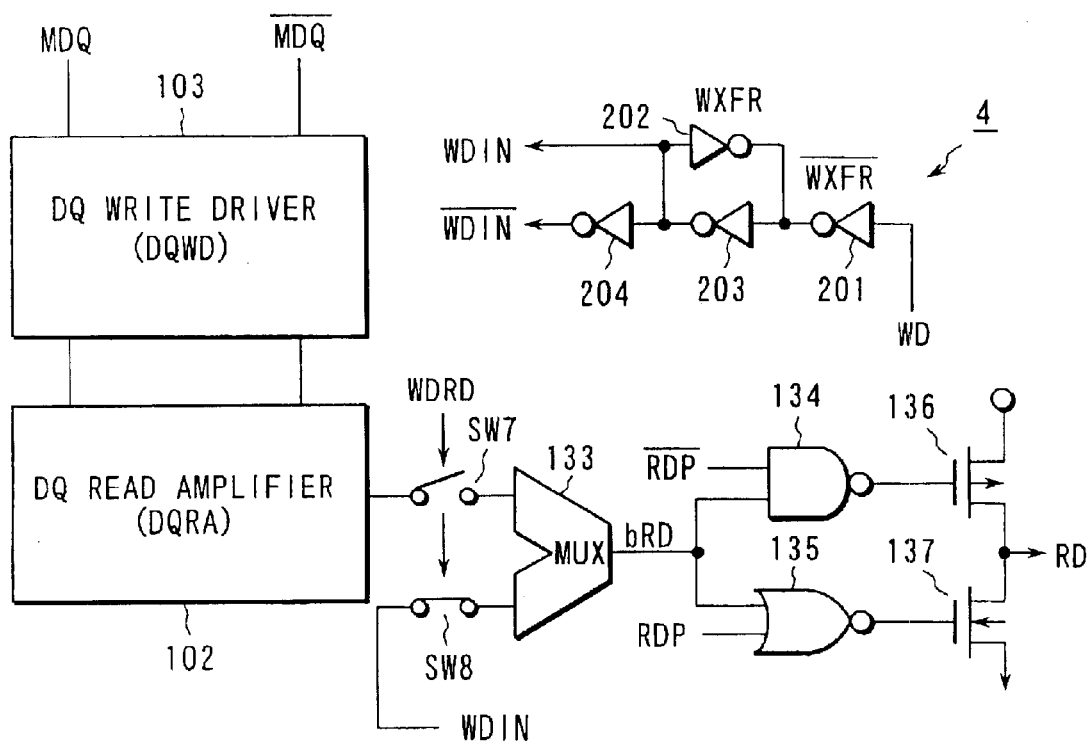
FIG. 9 is a circuit diagram showing an example of the construction of a readout data switching circuit for switching an output signal of a DQ read amplifier and an output signal of a data register in a circuit shown in FIG. 8.

FIGS. 6 to 9 illustrate a semiconductor memory device according to a third embodiment of this invention and FIG. 6 is a block diagram showing the schematic basic construction of an FCRAM. FIGS. 7A and 7B are block diagrams each showing the construction of an address coherency detector in the circuit shown in FIG. 6. FIG. 8 is a block diagram showing the schematic construction of an extracted portion associated with the data write and readout operation of a DDR-SDRAM and FIG. 9 is a circuit diagram showing an example of the construction of a readout data switching circuit for switching an output signal of a DQ read amplifier and an output signal of a data register in the circuit shown in FIG. 8.

The third embodiment is so constructed that data from the input data register 4 is directly read out instead of data from the memory cell when a read command is given before a next write command is given in the late write operation and if it coincides with an address which is held in the address register and in which the data write operation into the memory cell is not yet actually completed.

That is, as shown in FIG. 6, an address coherency detector 14 and readout data switching circuits SW1, SW2 are additionally provided in the circuit shown in FIG. 1. The address coherency detector 14 receives an address input to an address buffer 5, an address latched in an address register 3, write data latched in an input data register 4 and a control signal supplied from a command decoder & controller 2 and outputs a signal (for detecting coincidence of the addresses) WDRD which controls the ON/OFF states of the readout data switching circuits SW1, SW2. The readout data switching circuit SW1 is connected between an I/O control circuit 10 and a data output buffer 13 and the readout data switching circuit SW2 is connected between the I/O control circuit 10 and the input data register 4. The other construction is the same as the circuit shown in FIG. 1, the same symbols are attached to like portions and the detail explanation therefor is omitted.

The address coherency detector 14 is constructed as shown in FIGS. 7A and 7B, for example. In an example shown in FIG. 7A, the address coherency detector 14 includes a first checker 31 and a second checker 32. Write data latched in the input data register 4 is supplied to the first checker 31 and controlled by a control signal supplied from the command decoder & controller 2. The second checker 32 is supplied with an output signal of the first checker 31, an address signal input to the address buffer 5 and an address signal latched in the address register 3 and outputs a signal WDRD which controls the ON/OFF states of the readout data switching circuits SW1, SW2.

In an example shown in FIG. 7B, the address coherency detector 14 includes a register 33 and a checker 32. A control signal output from the command decoder & controller 2 is supplied to the register 33. The checker 32 is supplied with an output signal of the register 33, an address signal input to the address buffer 5 and an address signal latched in the address register 3 and outputs a signal WDRD which controls the ON/OFF states of the readout data switching circuits SW1, SW2.

The address coherency detector 14 shown in FIGS. 6, 7A and 7B interrupts access to the memory cell and reads out data held in the input data register 4 so as to maintain the coherency of data when a read command is given before a next write command is supplied and if it coincides with an address which is held in the address register 3 and in which the data write operation into the memory cell is not yet actually completed.

FIG. 8 shows the schematic construction of an extracted portion of the memory core section and a peripheral area thereof associated with the data write and readout operation of the FCRAM shown in FIG. 6 and a DDR-SDRAM is shown as an example. The circuit of FIG. 8 corresponds to and has basically the same construction as the circuit of FIG. 2, and therefore, the same symbols are attached to like portions and the detail explanation therefor is omitted. An output signal of a DQ read amplifier 102 is interrupted and data latched in the input data register 4 is output according to the output signal WDRD of the address coherency detector 14.

As shown in FIG. 9, for example, the readout data switching circuit includes switching circuits SW7, SW8, multiplexer (MUX) 133, NAND gate 134, NOR gate 135, P-channel MOS transistor (buffer transistor) 136 and N-channel MOS transistor (buffer transistor) 137. One input terminal of the multiplexer 133 is connected to the output terminal of the DQ read amplifier 102 via the switching circuit SW7 and the other input terminal thereof is connected to the internal node of the input data register 4 via the switching circuit SW8 (a signal WDIN is supplied thereto). The ON/OFF states of the switching circuits SW7, SW8 are controlled by the signal WDRD for detecting the coincidence of the addresses which is output from the address coherency detector 14. When the address coincidence is detected, the switching circuit SW8 is turned ON and the switching circuit SW7 is turned OFF to select data latched in the data register, and when address non-coincidence is detected, the switching circuit SW7 is turned ON and the switching circuit SW8 is turned OFF to select the output signal of the DQ read amplifier 102.

The output terminal (sense node bRD) of the multiplexer 133 is connected to one input terminal of the NAND gate 134 and one input terminal of the NOR gate 135. The other input terminal of the NAND gate 134 is supplied with a signal $\overline{RDP}$ and the other input terminal of the NOR gate 135 is supplied with a signal RDP. The signals $\overline{RDP}$, RDP are signals for determining whether the ON/OFF states of the MOS transistors 136, 137 are selectively controlled according to the potential level of the sense node bRD or both of the MOS transistors 136 and 137 are set in the OFF state to separate the data switching circuit from the readout data line RD. An output signal of the NAND gate 134 is supplied to the gate of the MOS transistor 136 whose source is connected to the power supply. An output signal of the NOR gate 135 is supplied to the gate of the MOS transistor 137 whose drain is connected to the drain of the MOS transistor 137 and whose source is connected to the ground node. Data is output from the drain common connection node of the MOS transistors 136 and 137 to the readout data line RD.

With the above construction, when the address coincidence is not detected in the address coherency detector 14, the switching circuits SW7 and SW8 are respectively set into the ON and OFF states so as to permit the output signal of the DQ read amplifier 102 to be supplied to the sense node bRD via the multiplexer 133, the ON/OFF states of the MOS transistors 136, 137 are controlled by the output signals of the NAND gate 134 and NOR gate 135, and as a result, data read out from the memory cell MC is output to the readout data line RD.

On the other hand, if the address coincidence is detected in the address coherency detector 14, the DQ read amplifier 102 is activated to turn OFF a signal CMA for sensing data on the data line pair MDQ, $\overline{MDQ}$ used for transferring data read out from the memory cell MC. As a result, the switching circuits SW7 and SW8 are respectively set into the OFF and ON states so as to permit data (signal WDIN) of the internal node of the input data register 4 to be transferred to the sense node bRD via the multiplexer 133, the ON/OFF states of the MOS transistors 136, 137 are controlled by the output signals of the NAND gate 134 and NOR gate 135, and as a result, data read out from the input data register 4 is output to the readout data line RD.

Thus, the sense result of the data line pair MDQ, $\overline{MDQ}$ and data latched in the input data register 4 are multiplexed in the sense node bRD. Then, data from the input data register 4 is directly read out instead of data from the memory cell MC when a read command is given before a next write command is supplied in the late write operation and if it coincides with an address which is held in the address register and in which the data write operation into the memory cell is not yet actually completed.

With the above construction, the data path becomes longer in comparison with the first and second embodiments, but the data path is the same as that in the normal readout operation and the access time will not be restricted by this operation.

Figure 10:
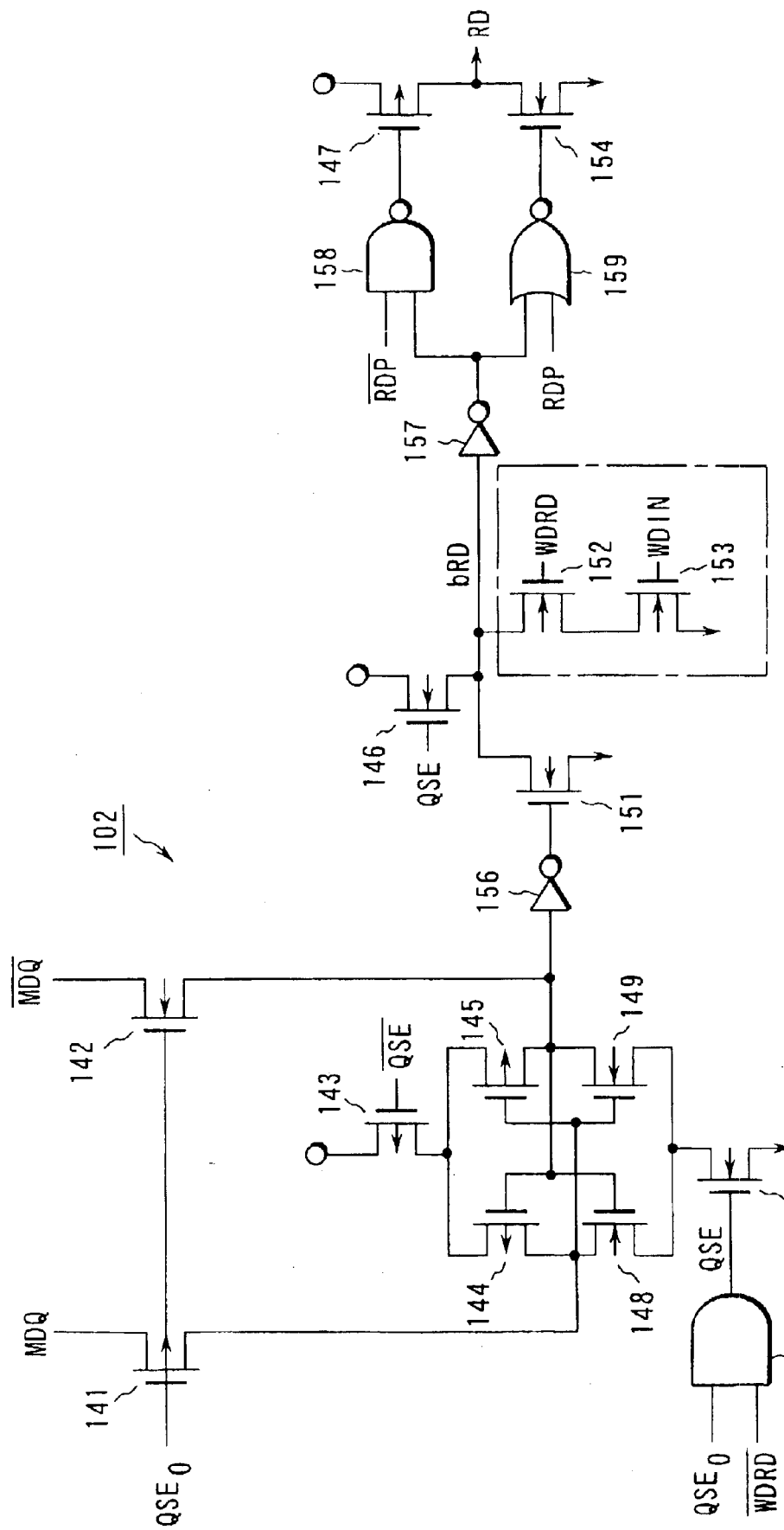
FIG. 10 is a circuit diagram showing another example of the construction of the DQ read amplifier and readout data switching circuit shown in FIG. 8.
Figure 11:
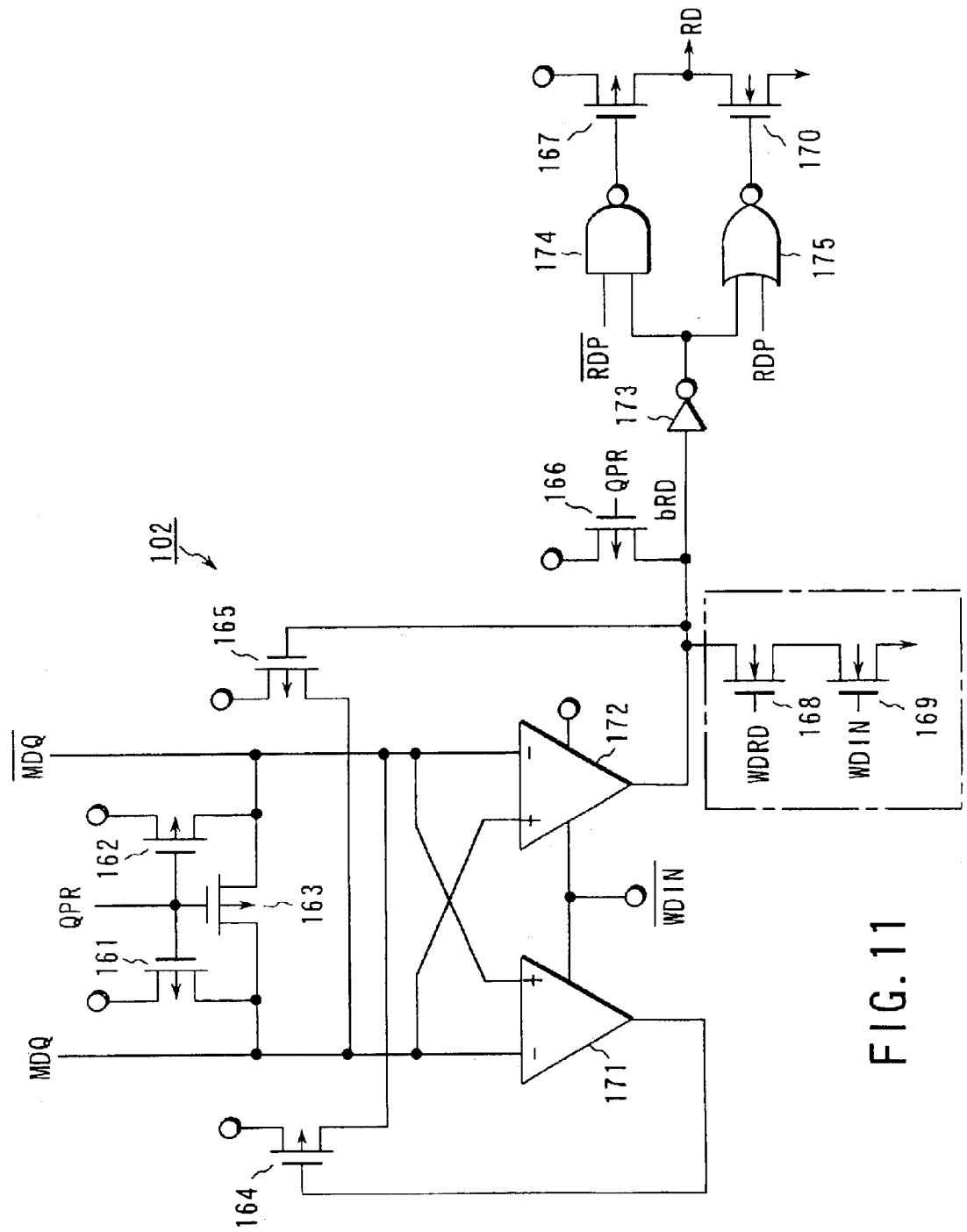
FIG. 11 is a circuit diagram showing still another example of the construction of the DQ read amplifier and readout data switching circuit shown in FIG. 8.

FIGS. 10 and 11 are circuit diagrams each showing another example of the construction of the DQ read amplifier 102 and readout data switching circuit shown in the circuit of FIG. 8.

The circuit shown in FIG. 10 includes P-channel MOS transistors 141 to 147, N-channel MOS transistors 148 to 154, AND gate 155, inverters 156, 157, NAND gate 158 and NOR gate 159. The paired data lines MDQ, $\overline{MDQ}$ are respectively connected to one-side ends of the current paths of the MOS transistors 141, 142 and the gates thereof are supplied with a sense enable signal QSEo of the data line pair MDQ, $\overline{\text{MDQ}}$. The other end of the current path of the MOS transistor 141 is connected to the drain common connection node of the MOS transistors 144, 148 and the gates of the MOS transistors 145, 149. The other end of the current path of the MOS transistor 142 is connected to the drain common connection node of the MOS transistors 145, 149, the gates of the MOS transistors 144, 148 and the input terminal of the inverter 156. The current path of the MOS transistor 143 is connected between the sources of the MOS transistors 144, 145 and the power supply and a signal $\overline{\text{QSE}}$ is supplied to the gate of the MOS transistor 143. The current path of the MOS transistor 150 is connected between the sources of the MOS transistors 148, 149 and the ground node and a signal QSE is supplied to the gate of the MOS transistor 150. The sense enable signal QSEO is supplied to one input terminal of the AND gate 155, the signal $\overline{\text{WDRD}}$ for detecting the address coincidence which is output from the address coherency detector 14 is supplied to the other input terminal thereof, an output signal QSE thereof is supplied to the gate of the MOS transistor 150 and an inverted signal $\overline{\text{QSE}}$ thereof is supplied to the gate of the MOS transistor 143.

The output terminal of the MOS transistor 156 is connected to the gate of the MOS transistor 151 whose drain is connected to the sense node bRD and whose source is connected to the ground node. The current path of the MOS transistor 146 is connected between the sense node bRD and the power supply and the output signal QSE of the AND gate 155 is supplied to the gate of the MOS transistor 146. Further, the current paths of the MOS transistors 152, 153 are serially connected between the sense node bRD and the ground node and the signal WDRD for detecting the address coincidence and the signal WDIN of the internal node are respectively supplied to the gates of the MOS transistors 152, 153.

The input terminal of the inverter 157 is connected to the sense node bRD and the output terminal thereof is connected to one input terminal of the NAND gate 158 and one input terminal of the NOR gate 159. The other input terminal of the NAND gate 158 is supplied with the signal $\overline{\text{RDP}}$ and the other input terminal of the NOR gate 159 is supplied with the signal RDP. The output terminal of the NAND gate 158 is connected to the gate of the MOS transistor (buffer transistor) 147 whose source is connected to the power supply. The output terminal of the NOR gate 159 is connected to the gate of the MOS transistor (buffer transistor) 154 whose drain is connected to the drain of the MOS transistor 147 and whose source is connected to the ground node. The circuit is so constructed as to output a signal to the readout data line RD connected to the drain common connection node of the MOS transistors 147, 154.

With the above construction, if the address coincidence is detected by the address coherency detector 14 to set the signal WDRD to the "H" level and set the signal $\overline{\text{WDRD}}$ to the "L" level, the output signal QSE of the AND gate 155 is set to the "L" level ($\overline{\text{QSE}}$ is set to the "H" level) irrespective of the level of the sense enable signal SQEO. Therefore, the MOS transistors 143, 150 are set into the OFF state and the MOS transistor 146 is set into the ON state. As a result, the potential of the input terminal of the inverter 156 is fixed at the "H" level and the potential of the output terminal thereof is set to the "L" level to set the MOS transistor 151 into the OFF state so that the sense node bRD will be separated from the DQ read amplifier 102.

At this-time, the sense node bRD is precharged to the "H" level by means of the MOS transistor 146 which is set in the ON state and the ON/OFF state of the MOS transistor 153 is controlled by the signal WDIN of the internal node of input data register 4 to determine whether the precharge state of the sense node bRD is maintained or discharged according to the level of the signal WDIN. The MOS transistors 147, 154 are selectively driven by the NAND gate 158 and NOR gate 159 according to the potential level of the sense node bRD and the readout data line RD is driven according to data latched in the data register 102.

On the other hand, when the address coincidence is not detected by the address coherency detector 14, the signal $\overline{\text{WDRD}}$ is set to the "H" level and the signal WDRD is set to the "L" level, and if the sense enable signal SQEO is set to the "HH" level, the output signal QSE of the AND gate 155 is set to the "HH" level ($\overline{\text{QSE}}$ is set to the "L" level). As a result, the MOS transistors 143, 150 are set into the ON state and the MOS transistor 146 is set into the OFF state. Therefore, whether or not the potential of the sense node bRD is discharged via the MOS transistor 151 is determined according to the potential levels of the paired data lines MDQ, $\overline{\text{MDQ}}$. The MOS transistors 147, 154 are selectively driven by the NAND gate 158 and NOR gate 159 according to the potential level of the sense node bRD and the readout data line RD is driven according to data read out from the memory cell MC.

The circuit shown in FIG. 11 includes P-channel MOS transistors 161 to 167, N-channel MOS transistors 168 to 170, operational amplifiers 171, 172, inverter 173, NAND gate 174 and NOR gate 175. The MOS transistors 161 to 163 construct a precharge/equalizing circuit for precharging and equalizing the paired bit lines MDQ and $\overline{\text{MDQ}}$. The current path of the MOS transistor 161 is connected between the data line MDQ and the power supply, the current path of the MOS transistor 162 is connected between the data line $\overline{\text{MDQ}}$ and the power supply, and the current path of the MOS transistor 163 is connected between the paired data lines MDQ and $\overline{\text{MDQ}}$. The gates of the MOS transistors 161 to 163 are supplied with a precharge signal QPR.

The inverting input terminal (−) of the operational amplifier 171 is connected to the data line MDQ and the non-inverting input terminal (+) thereof is connected to the data line $\overline{\text{MDQ}}$. The inverting input terminal (−) of the operational amplifier 172 is connected to the data line $\overline{\text{MDQ}}$ and the non-inverting input terminal (+) thereof is connected to the data line MDQ. The signal $\overline{\text{WDIN}}$ of the internal node is supplied to the operational amplifiers 171, 172 to control the operation thereof. The current path of the MOS transistor 164 is connected between the power supply and the data line $\overline{\text{MDQ}}$ and the gate of the MOS transistor 164 is connected to the output terminal of the operational amplifier 171. The current path of the MOS transistor 165 is connected between the power supply and the data line MDQ and the gate of the MOS transistor 165 is connected to the output terminal of the operational amplifier 172.

The current paths of the MOS transistors 168, 169 are serially connected between the output terminal (sense node bRD) of the operational amplifier 172 and the ground node and the output signal WDRD of the address coherency detector 14 and the signal WDIN of the internal node of the input data register 4 are respectively supplied to the gates of the MOS transistors 168 and 169. Further, the current path of the MOS transistor 166 is connected between the output terminal of the operational amplifier 172 and the power supply and the precharge signal QPR is supplied to the gate of the MOS transistor 166.

The input terminal of the inverter 173 is connected to the sense node bRD and the output terminal thereof is connected to one input terminal of the NAND gate 174 and one input terminal of the NOR gate 175. The signal $\overline{\text{RDP}}$ is supplied to the other input terminal of the NAND gate 174 and the signal RDP is supplied to the other input terminal of the NOR gate 175. The signals $\overline{\text{RDP}}$, RDP are signals for determining whether the ON/OFF states of the MOS transistors 167, 170 are selectively controlled according to the potential level of the sense node bRD or both of the MOS transistors 167 and 170 are set in the OFF state to separate the circuit from the readout data line RD. The output terminal of the NAND gate 174 is connected to the gate of the MOS transistor (buffer transistor) 167 whose source is connected to the power supply. The output terminal of the NOR gate 175 is connected to the gate of the MOS transistor (buffer transistor) 170 whose drain is connected to the drain of the MOS transistor 167 and whose source is connected to the ground node. The circuit is so constructed as to output a signal to the readout data line RD connected to the drain common connection node of the MOS transistors 167, 170.

In the DQ read amplifier 102 and readout data switching circuit with the above construction, basically the same operation as that of the circuit shown in FIG. 9 is effected, and data from the input data register 4 can be directly read out instead of data from the memory cell MC when a read command is given before a next write command is supplied in the late write operation and if it coincides with an address which is held in the address register and in which the data write operation into the memory cell is not yet actually completed.

As described above, according to these embodiments of this invention, a semiconductor memory device can be provided in which the data path used for writing data into the memory cell based on the contents of the address register is shortened so that the random cycle time at the write time can be reduced.

Further, a semiconductor memory device can be provided in which the chip size can be reduced by making the pattern occupancy area of the data register small.

In addition, a fast cycle random access memory having an improved data write operation can be provided.

Also, an improved write method for a fast cycle random access memory can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   means for latching an address of a memory cell into which data is to be written;
   means for latching data to be written into the memory cell; and
   means for driving a data line pair according to write data latched in said means for latching data;
   wherein writing of data fetched from the exterior in response to input of a command is started when a next command is set.

2. A semiconductor memory device comprising:
   a memory core section;
   first latching means for latching an address of a memory cell into which data is to be written, said first latching means being, provided in said memory core section;
   second latching means for latching data to be written into the memory cell, said second latching means being provided in said memory core section; and
   driving means for driving a data line pair according to data latched in said second latching means, said driver means being arranged in said memory core section in a repeated pattern at a pitch which is substantially a multiple of that of bit line pairs;
   wherein writing of data fetched from the exterior in response to input of a command is started when a next command is set.

3. The semiconductor memory device according to claim 2, wherein the command is input once for each random cycle time to define a read/write operation.

4. The semiconductor memory device according to claim 3, further comprising:
   gate means, the ON/OFF states of said gate means being controlled by a potential level of a corresponding one of column selection lines, and said gate means being respectively provided between the data line pair and the bit line pairs; and
   decoding means for decoding a column address signal latched in said first latching means to selectively drive a corresponding one of the column selection lines;
   wherein write data is transferred to and latched in said second latching means in response to input of the command, said driving means is operated in response to input of a command in a next clock cycle to drive the data line pair according to write data latched in said second latching means, and then a corresponding one of said gate means is turned ON to write data on the data Line pair into the corresponding memory cell via the bit line pair.

5. The semiconductor memory device according to claim 2, wherein the command is a combination of first and second commands supplied as a packet in two successive clock cycles to define an operation.

6. The semiconductor memory device according to claim 5 further comprising:
   gate means for transferring the data, the ON/OFF states of said gate means being controlled by a potential level of a corresponding one of column selection lines, and said gate means being respectively provided between the data line pair and the bit line pairs; and
   decoding means for decoding a column address signal latched in said first latching means to selectively drive a corresponding one of the column selection lines;
   wherein write data is transferred to and latched in said second latching means in response to input of the first command, said driving means is operated to transfer write data transferred to said second latching means to the data line pair in response to a first command in a next clock cycle, and then a corresponding one of said gate means is turned ON in response to input of the second command to write data on the data line pair into the corresponding memory cell via the bit line pair.

7. A semiconductor memory device comprising:
   a memory core section;
   first latching means for latching an address of a memory cell into which data is to be written, said first latching means being provided in said memory core section;
   second latching means for latching data to be written into the memory cell, said second latching means being provided in said memory core section;
   driving means for driving a corresponding one of data line pairs according to write data latched in said second latching means, said driving means being arranged in said memory core section;

amplifying means for amplifying readout data read out on the data line pair, said amplifying means being provided in correspondence to said driving means in said memory core section;

coherency detecting means for determining whether or not an input address coincides with an address which is held in said first latching means and the data write operation of which into the memory cell is not yet actually completed; and switching means for selectively supplying one of readout data amplified by said amplifying means and data latched in said second latching means to a readout data line in response to an output signal of said coherency detecting means;

wherein writing of data latched in said second latching means into the memory cell in response to input of a write command is started in response to input of a write command in a next clock cycle, a sense operation of data on the data line pair is interrupted when a read command is input before the next write command and coincidence of the addresses is detected in said coherency detecting means, and then, data latched in said second latching means is selected instead of the amplification result of said amplifying means by use of said switching means, transferred to a readout data line pair and output to the exterior.

8. The semiconductor memory device according to claim 7, further comprising:

gate means for transferring the data, the ON/OFF states of said gate means being controlled by a potential level of a corresponding one of column selection lines, the gate means being respectively provided between the data line pairs and the bit line pairs; and decoding means for decoding a column address signal latched in said first latching means to selectively drive a corresponding one of the column selection lines;

wherein write data is transferred to and latched in said second latching means in response to input of a write command, said driving means is operated to transfer write data transferred to said second latching means to the data line pair in response to a write command in a next clock cycle, and then, a corresponding one of said gate means is turned ON by driving the column selection line in response to input of a column address latch command to write data on the data line pair into the corresponding memory cell via the bit line pair.

9. The semiconductor memory device according to claim 7, wherein said amplifying means, said driving means and said second latching means are formed at a pitch which is substantially a multiple of that of the bit line pairs.

10. A fast cycle random access memory comprising:

first buffer means for receiving a clock signal used as a reference of an operation timing from the exterior;

decoding & controlling means supplied with a control signal and command, for decoding the command and controlling the operations of circuits based on the result of decoding and the control signal;

second buffer means supplied with an address signal, for outputting a row address signal and column address signal in response to the clock signal supplied from said first buffer means;

register means for latching address information of a memory cell subjected to a late write operation, said register means being connected to said second buffer means;

a memory cell array having memory cells arranged therein;

first decoding means for decoding a row address signal supplied from said second buffer means to select a row of a memory cell in said memory cell array;

second decoding means for decoding a column address signal supplied from said second buffer means to specify a column of a memory cell in said memory cell array;

amplifying and transferring means for sensing and amplifying data to be written into the memory cell or data read out from the memory cell and then transferring the data;

controlling means for controlling input/output of data;

data input means to which write data input to a data pin is input, the write data input to said data input means being supplied to a selected one of the memory cells in said memory cell array via said controlling means and said amplifying & transferring means;

input data latching means for latching write data information of a memory cell subjected to the late write operation, said input data latching means being connected to said data input means; data output means to which readout data from a selected one of the memory cells in said memory cell array is supplied via said amplifying & transferring means and said controlling means, said data output means outputting readout data from the data pin; and control signal generating means supplied with an output signal of said first buffer means and an output signal of said decoding and controlling means, for generating control signals for controlling said first decoding means, said second decoding means, said input data latching means, said controlling means, said data input means and said data output means;

wherein said memory cell array, register means, said first decoding means, said second decoding means, said amplifying and transferring means and said controlling means are arranged in a memory core section, and said first buffer means, said decoding and controlling means, said first latching means, said control signal generating means, said data input means and said data output means are arranged in a peripheral area of the memory core section.

11. The fast cycle random access memory according to claim 10, wherein said controlling means includes a DQ read amplifier and a DQ write driver and is arranged near said memory cell array.

12. The fast cycle random access memory according to claim 11, wherein said input data latching means is arranged near said DQ read amplifier, said DQ write driver and said memory cell array.

13. The fast cycle random access memory according to claim 12, further comprising:

serial/parallel converting means for converting serial data supplied to said data input means into parallel data;

a write data line for transferring parallel data output from said serial/parallel converting means to said input data latching means;

a readout data line supplied with readout data output from said amplifying means; and parallel/serial converting means for converting parallel data supplied to said readout data line into serial data and transferring the serial data to said data output means.

14. The fast cycle random access memory according to claim 13, further comprising:

coherency detecting means for determining whether or not an address signal input to said first buffer means and an address signal which is held in said register means and the data write operation of which into the memory cell is not yet actually completed coincide with each other; and switching means for selectively supplying one of the readout data amplified by said amplifying means and data latched in said input data latching means to said readout data line in response to an output signal of said coherency detecting means;

wherein the sense operation of data on the data line pair is interrupted when a read command is input before the next write command and coincidence of the addresses is detected in said coherency detecting means and data latched in said input data latching means is selected instead of the amplification result of said amplifying means by use of said switching means, transferred to a readout data line pair and output to the exterior.

15. The fast cycle random access memory according to claim 14, wherein said coherency detecting means includes:

a first checking circuit supplied with an output signal of said input data latching means and controlled by said decoding & controlling means; and second checking circuit supplied with an output signal of said first checking circuit, an output signal of said second buffer means and an output signal of said register means, for outputting a signal for controlling the ON/OFF state of said switching means.

16. The fast cycle random access memory according to claim 14, wherein said coherency detecting means includes a register circuit supplied with an output signal of said decoding & controlling means; and a checking circuit supplied with an output signal of said register circuit, an output signal of said second buffer means and an output signal of said register means, for outputting a signal for controlling the ON/OFF state of said switching means.

17. A data write method for a fast cycle random access memory comprising:

supplying serial data input to a data pin from the exterior to a data input buffer, converting the serial data into parallel data in a serial/parallel converting circuit and then transferring the parallel data to an input data register provided adjacent to a DQ write driver via a write data line; and writing data, which is latched in said input data register in a preceding write cycle, into a memory cell via the DQ write driver, a data line pair, an I/O gate and a bit line pair when data is written into the memory cell in a next write cycle.

18. A data write method for a fast cycle random access memory comprising:

supplying a write command used as a first command and a column address latch command used as a second command as one packet;

fetching the write command and column address latch command in synchronism with two successive clock signals;

generating a write gate pulse in response to input of the write command to activate a DQ write driver and drive a data line pair according to the contents of an internal node of an input data register; and selecting a column selection line in response to input of the column address latch command, turning ON an I/O gate to transfer data on the data line pair to a bit laine pair and writing the data into a memory cell.

* * * * *